United States Patent [19]
O'Connor et al.

[11] Patent Number: 5,486,702
[45] Date of Patent: Jan. 23, 1996

[54] SCAN TECHNIQUE TO REDUCE TRANSIENT WAFER TEMPERATURES DURING ION IMPLANTATION

[75] Inventors: John P. O'Connor, Andover; John W. Smith, Newburyport, Mass.

[73] Assignee: Genus, Inc., Sunnyvale, Calif.

[21] Appl. No.: 125,117

[22] Filed: Sep. 21, 1993

[51] Int. Cl.⁶ .................................................. H01J 37/317
[52] U.S. Cl. ...................... 250/492.21; 250/397; 250/398
[58] Field of Search ........................... 250/492.2, 492.21, 250/397, 398

[56] References Cited

U.S. PATENT DOCUMENTS

| | | | |
|---|---|---|---|
| 3,778,626 | 12/1973 | Robertson | 250/492.2 |
| 4,234,797 | 11/1980 | Ryding | 250/492.2 |
| 4,393,312 | 7/1983 | Collier et al. | 250/492.2 |
| 4,449,051 | 5/1984 | Berkowitz | 250/492.21 |
| 4,570,070 | 2/1986 | Tabei | 250/492.21 |
| 4,712,013 | 12/1987 | Nishimura et al. | 250/492.2 |
| 5,124,557 | 6/1992 | Aitken | 250/443.1 |
| 5,194,748 | 3/1993 | Aitken | 250/492.21 |
| 5,216,253 | 6/1993 | Koike | 250/492.21 |

OTHER PUBLICATIONS

Benveniste, "Wafer Cooling in a High Current Ion Implanter" (Amsterdam, North Holland, 1992).
Mack, "Wafer Cooling and Wafer Charging in Ion Implantation" (Nuc. Instr. and Meth. 821 (1987) 366).

*Primary Examiner*—Jack I. Berman
*Assistant Examiner*—James Beyer
*Attorney, Agent, or Firm*—Nields & Lemack

[57] ABSTRACT

During ion implantation, beam heating of the substrates must be reduced to eliminate self-annealing of the wafers during implant and to eliminate damager to masking materials, principally photoresist, that is mounted on the surface of the wafers. In this work, we describe a technique which may be used with both single-wafer and batch ion implantation systems to reduce transient wafer temperatures during implant.

13 Claims, 10 Drawing Sheets

SCAN TECHNIQUE TO REDUCE TRANSIENT WAFER TEMPERATURES DURING ION IMPLANTATION

BACKGROUND OF THE INVENTION

1. Field of the Invention

The present invention relates to the implantation of ions into semiconductor materials, and in particular, to a technique to reduce transient temperature effects in the semiconductor materials during implantation.

2. Description of the Prior Art

In ion implantation, a beam of ions with energies ranging from approximately 1 keV up to 3 MeV and beam currents varying from less than 1 microampere up to 100 milliamperes are incident upon a semiconductor substrate, typically silicon wafers. This results in incident beam powers of up to several kW. In addition, for implantation to be effective, a uniform distribution of the ions must be obtained in the semiconductor substrate. These two factors must be considered when designing an implant system to ensure that deleterious heating effects are reduced while simultaneously ensuring that a uniform ion distribution is obtained.

A number of cooling techniques have been developed to decrease the power density (W/cm$^2$) incident upon the semiconductor (see for example, Robertson U.S. Pat. No. 3,778,626) and also to enhance the conduction cooling between the wafer and its mounting assembly (see the article by M. E. Mack in *Handbook of Ion Implantation Technology*, ed. J. F. Ziegler (Amsterdam, North Holland, 1992) and references cited therein).

In some systems, the beam is electrostatically scanned across the wafer at frequencies of several kHz. This approach permits approximately uniform distributions to be obtained and also results in transient temperatures that are equal across the wafer. However, this approach does not permit the use of high power densities to be employed during implantation.

In some systems, the implant dosimetry is controlled by a dual mechanically scanned system. Examples of such systems are described by Robertson in the aforementioned U.S. Pat. No. 3,778,626 and by Ryding in U.S. Pat. No. 4,234,797. In these systems, the wafers are mounted on the perimeter of a metal disk which rotates at high speeds, typically 500–1500 revolutions per minute (rpm). The spinning of the disk moves the wafers at high speed through the ion beam in one direction. Relative movement between the wafers and the ion beam in a direction transverse to said one direction is produced either by imparting a slow scanning movement to the ion beam across the wafers or imparting a slow scanning movement to the spinning disk. In the technique described by Ryding in U.S. Pat. No. 4,234,797, the beam current is sampled by a Faraday cup situated behind the spinning disk. There is a slot or number of slots cut into the disk along a radius or radii. During each revolution of the disk, a fraction of the beam passes through the slots and impacts into the Faraday cup. The sampled current is integrated and the accumulated charge drives the scan system in the direction transverse to the spinning direction. At the end of a scan, the slow scan direction is reversed and the beam again passes over the wafers. In this way, the dose is uniformly deposited into the wafer and the beam power is averaged over a large scan area to reduce the power density. However, this approach does not adequately address transient wafer heating effects.

A good description of the wafer heating effects, including transient effects, in a mechanically scanned ion implanter is found in the work by V. Benveniste described in Nucl. Instr. and Meth. B21 (1987) 366. His computer simulations demonstrate that in a mechanically scanned system of this type both the inner and outer edges of the wafer have significantly larger transient temperature excursions than the center of the wafer (see FIG. 2 of the aforementioned article by Benveniste.)

The mechanically scanned ion implanters of the prior art have been designed so as to maximize throughput of the implanters, and therefore provide a back-and-forth slow scan on top of a rotary motion fast scan. Whatever reasoning may be involved, the technical literature to date has not disclosed any use of a flyback technique, nor any suggestion of any benefit to be derived therefrom. Presumably it was thought that the inactivity of ion implantation during flyback was a substantial economic disadvantage.

SUMMARY OF THE INVENTION

We have discovered an approach that will reduce transient temperatures across silicon wafers in systems that utilize mechanical scans to ensure dose uniformity. In accordance with our invention the slow active mechanical scans in one direction are alternated with rapid inactive mechanical scans in the reverse direction.

BRIEF DESCRIPTION OF THE DRAWINGS

The invention may best be understood from the following detailed description thereof, having reference to the accompanying drawings, in which.

DESCRIPTION OF THE PREFERRED EMBODIMENT

Figure 8:
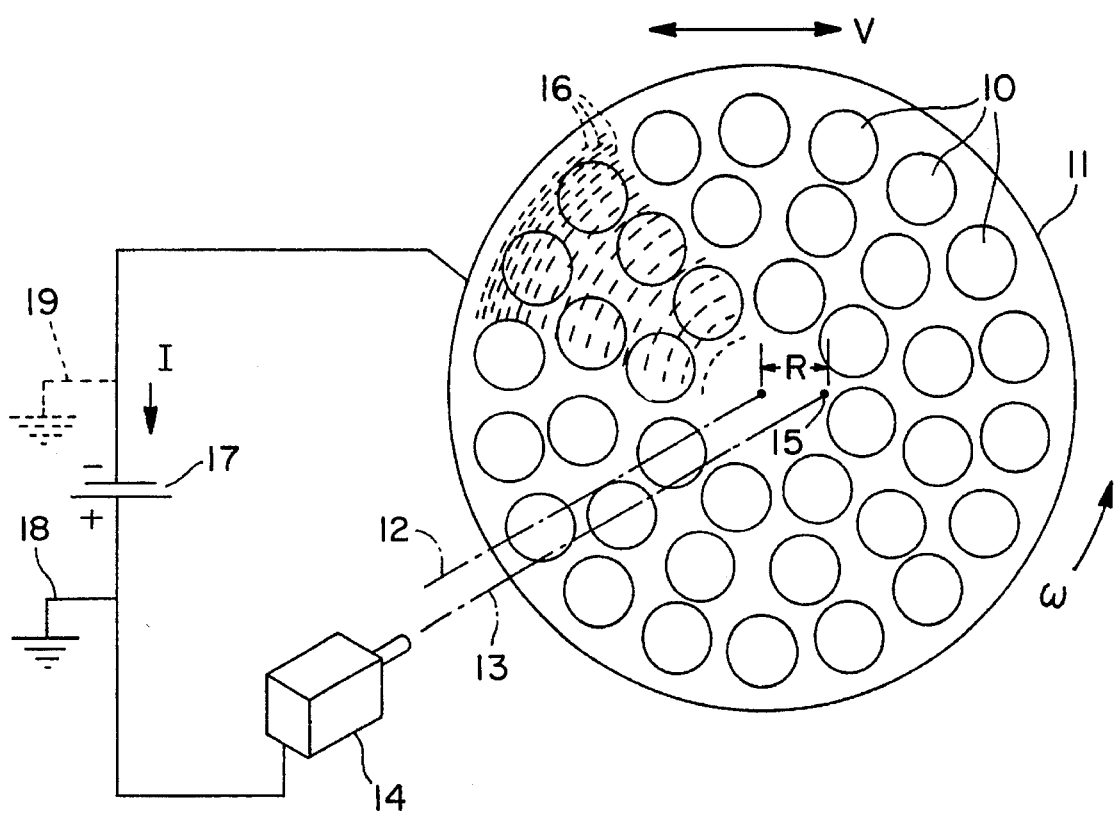
FIG. 8 is a partially schematic, partially diagrammatic view of a target for holding workpieces to be implanted with ions in accordance with the prior art disclosure of Robertson in the aforementioned U.S. Pat. No. 3,778,626.

Referring now to FIG. 8, workpieces 10 are temporarily attached to a target 11, which is rotated at an angular velocity ω and traversed at a velocity V by means which are described in Robertson. The workpieces 10 are preferably evenly distributed on the target 11 so that the target is balanced and can be rotated at speeds as high as 1,200 r.p.m. A typical target is a disc 20 inches in diameter holding 60 workpieces. Each workpiece is typically a disc of semiconductor material 0.010 inch thick and 2 inches in diameter.

An ion beam 13 from an ion source 14 is directed through analyzing, accelerating and focusing apparatus (not shown) onto an area 15 of the workpieces 10 spaced at a radial distance R from the axis 12. Ions from the ion beam 13 are implanted in the workpieces 10 in a spiral path 16 as the target 11 is rotated and traversed by means (not shown) which are disclosed in Robertson. The workpieces 10 and the target 11 are maintained at a high potential with respect to the ion source 14 by a high voltage source 17 to impart the necessary implantation energy to the ions in the ion beam 13. The movement of ions in the ion beam is measured as a current I which flows in the connections to the high-voltage source 17.

Typically the ion-source end of an ion implantation apparatus is maintained at ground potential, as indicated by a ground connection 18. Alternatively, the target end of the ion implantation apparatus can be maintained at ground potential, as shown in phantom representation by a ground connection 19.

An ion dose D is implanted in the workpieces 10 during each traversal of the target 11 with respect to the ion beam 13. The magnitude of the ion dose D can be regulated by controlling either the ion beam current I or the traversing velocity V. The ion beam current is difficult to control; therefore, the ion dose D is more readily regulated by controlling the traversing velocity V.

The ion dose D is independent of the rotational velocity ω if the rotational velocity is sufficiently high that fluctuations in the ion beam current I are averaged over all the workpieces 10.

The ion density within the ion beam 13 is non-uniform, and generally follows a Gaussian distribution. Therefore, each trace of the ion beam 13 implants a non-uniform ion dose in the workpieces 10. However, the traversing velocity V is scaled to the rotational velocity ω so that the pitch of the spiral path 16 is small, preferably less than 2 percent of the radial dimension of the area 15. This small pitch results in a large overlap of adjacent traces.

A typical implantation run comprises several successive traversals. Because the traversing velocity V is not precisely synchronized with the rotational velocity ω, the traces from successive spirals tend to overlap randomly. Because of the overlap between adjacent traces within each spiral, and the random overlap between successive spirals, the non-uniformities in the overlapping traces average so that the total ion dose in the workpieces 10 is essentially uniform.

Figure 1:
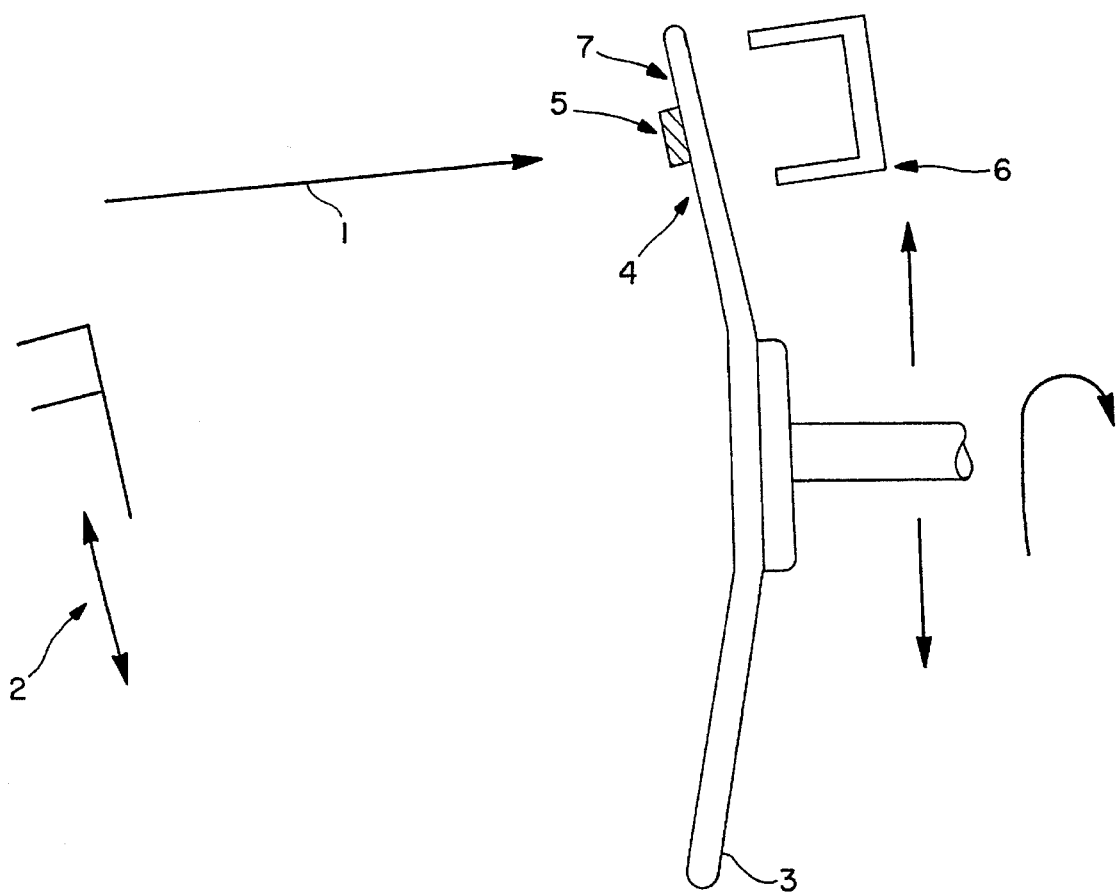
FIG. 1 is a diagrammatic sketch showing one combination of a spinning target and an insertable setup Faraday cup in accordance with the invention.

In one embodiment of the invention, shown in FIG. 1, the implantation is performed using a dual mechanical scanned system such as that described by Robertson or Ryding in the aforementioned U.S. Pat. Nos. 3,778,626 and 4,234,797, respectively. In this approach, the beam current in the beam 1 from the ion implanter is optimized in a setup Faraday cup 2 situated upstream of the spinning disk 3. When the implant begins, the setup Faraday cup is retracted from the beam. The beam current strikes the disk at a radius 4 (radius A) where no beam is incident upon the wafers 5. As discussed above in the approach of Ryding in U.S. Pat. No. 4,234,797, the beam current is sampled by a second Faraday cup 6 situated behind a spinning disk. The beam current is integrated and is used to drive a servomechanical system that imparts a motion to the disk in a direction transverse to the spinning direction. By proper control of the servomechanical system, a uniform distribution of ions will be implanted into the semiconductor wafers. At the end of a scan across the wafer the ion beam is at a radius 7 (radius B) at which the ion beam is no longer impacting upon the wafers and is gated off by the setup Faraday cup situated upstream of the spinning disk. The control system then drives the servomechanical system at a high rate of speed (several inches per second) from radius B to radius A. This motion is called the flyback of the system. At this point, the setup Faraday cup is again retracted from the beam, and the cycle is repeated; that is to say, the beam current is sampled by the Faraday cup situated behind the disk, is integrated, and is used to drive the servomechanical system from radius A toward radius B.

Figure 2A:
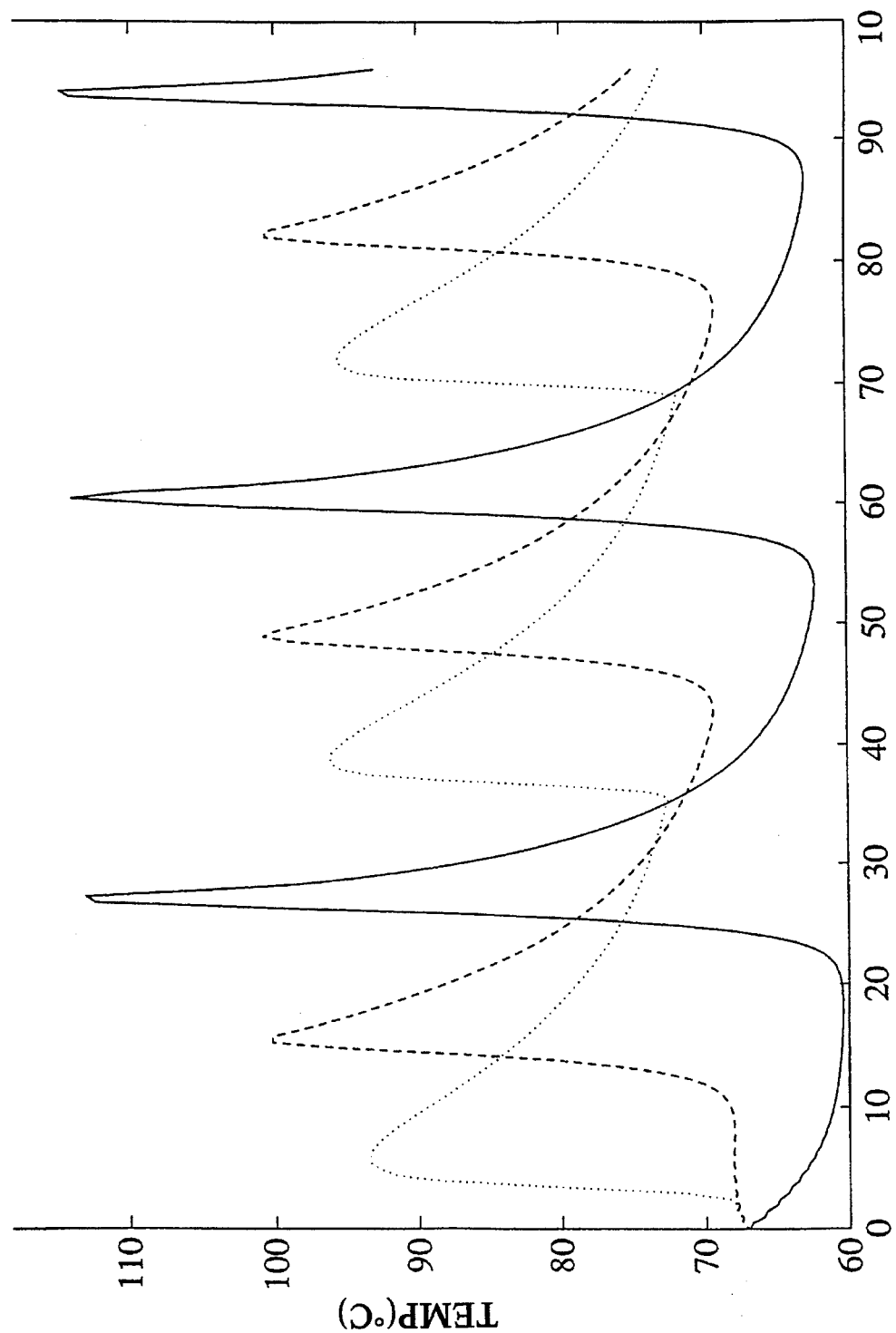
FIG. 2A is a graph showing variation of temperature as a function of elapsed time for various positions on the target of FIG. 1 when operated according to the invention.
Figure 2B:
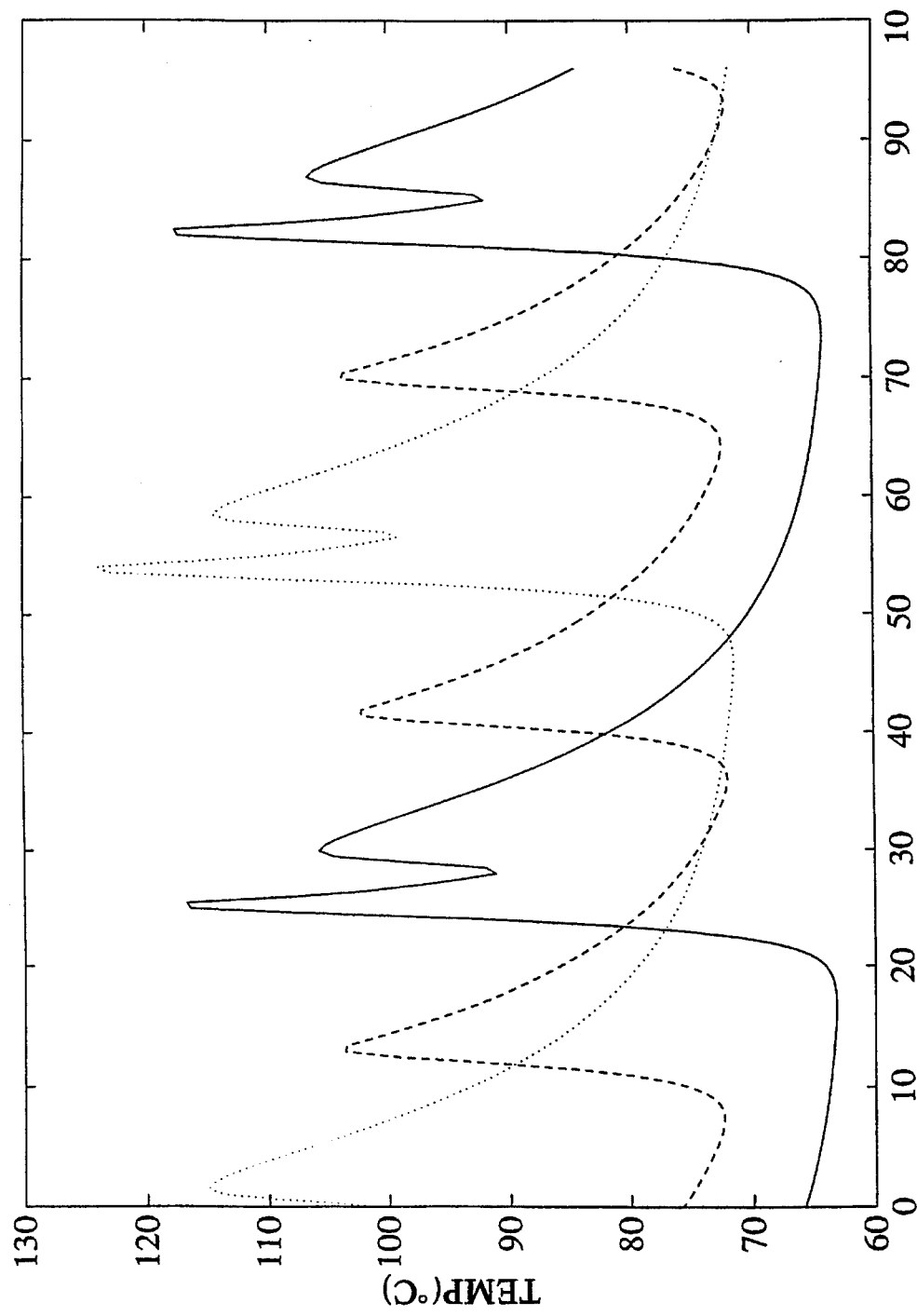
FIG. 2B is a graph showing variation of temperature as a function of elapsed time for various positions on the target of FIG. 1 when operated according to the prior art.

As a result of this approach, transient temperature excursions observed by the semiconductor wafers are minimized across the wafer. A contrast of this approach with that of earlier systems is shown in FIG. 2. A comparison of FIGS. 2a and 2b demonstrates that a significant reduction in the maximum wafer transient temperature is obtained with systems utilizing our invention when compared with conventional systems. In particular, for implants with identical input power conditions [1000 W with a 1 $cm^2$ ion beam] and identical transverse scan speeds [0.33 inches per second], the maximum temperature observed on systems utilizing this flyback approach is 12° C. lower than conventional systems.

In the graph of FIGS. 2a and 2b the solid line represents the temperature at that edge of an 8-inch wafer which is nearest the axis of rotation; the dashed line represents the temperature at the center of the wafer; and the dotted line represents the temperature at that edge of the wafer which is most remote from the axis of rotation.

Figure 3:
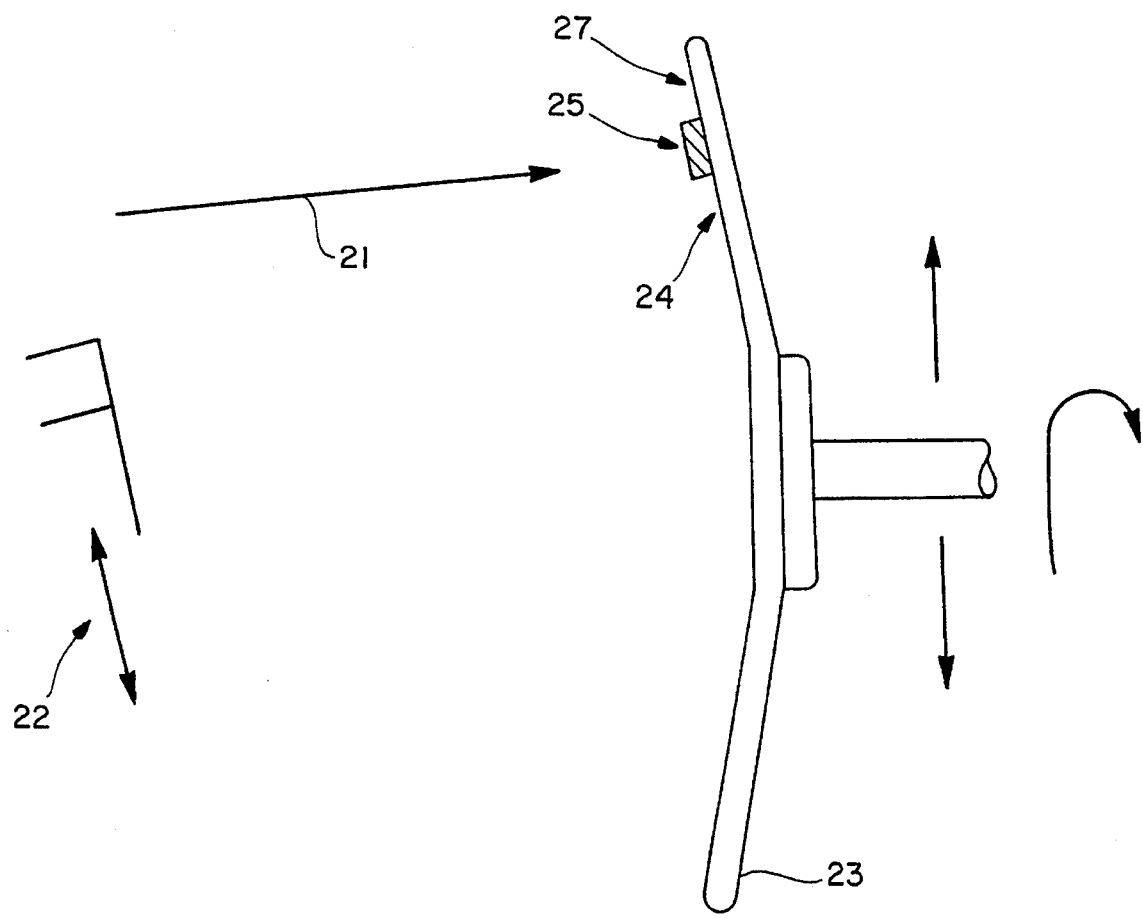
FIG. 3 is a diagrammatic sketch showing a second combination of a spinning target and an insertable setup Faraday cup in accordance with the invention.

In a second embodiment, shown in FIG. 3, the implanter uses a dual mechanical scan such as described by Robertson in U.S. Pat. No. 3,778,626. However, instead of using a Faraday cup behind the spinning disk to sample the ion beam current as described by Ryding in U.S. Pat. No. 4,234,797, the entire disk assembly is used as a Faraday cup to measure the beam current when the ion beam is incident upon the disk. In operation, the beam current in the beam 21 from the implanter is optimized in a setup Faraday cup 22 situated upstream of the spinning disk assembly 23. When the implant begins, the setup Faraday cup is retracted from the beam. The beam current strikes the disk at a radius 24 (radius A) where no beam is incident upon the wafers 25. The entire disk assembly measures the total beam current. This current is then integrated and is used to drive a servomechanical system that imparts a motion to the disk in a direction transverse to the spinning direction. By proper control of the servomechanical system, a uniform distribution of ions will be implanted into the semiconductor wafers. At the end of a scan across the wafer the ion beam is at a radius 27 (radius B) at which the ion beam is no longer impacting upon the wafers and is gated off by the setup Faraday cup situated upstream of the spinning disk. The control system then drives the servomechanical system at a high rate of speed (several inches per second) from radius B to radius A. This motion is called the flyback of the system. At this point, the setup Faraday cup is again retracted from the beam, and the cycle is repeated; that is to say, the beam current is measured by the entire disk assembly functioning as a Faraday cup. The current is integrated and used to drive the servomechanical system from radius A toward radius B.

This embodiment of the invention will produce transient temperature excursions which are reduced at all radii of the semiconductor wafer. The results shown in FIG. 2a are typical of those obtained with this embodiment.

Figure 4A:
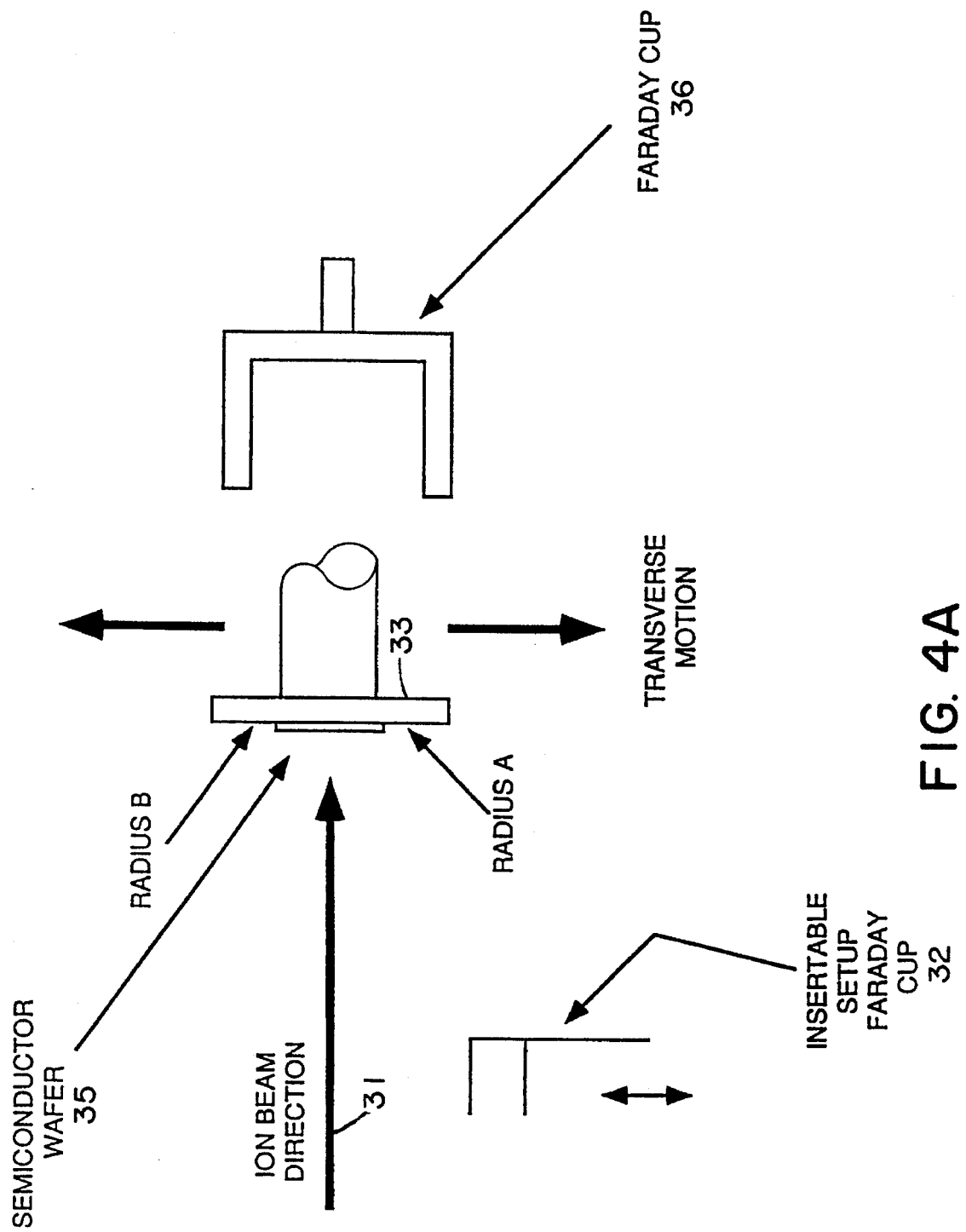
FIG. 4A is a somewhat diagrammatic top view showing one combination of a reciprocating target and an insertable setup Faraday cup in accordance with the invention.
Figure 4B:
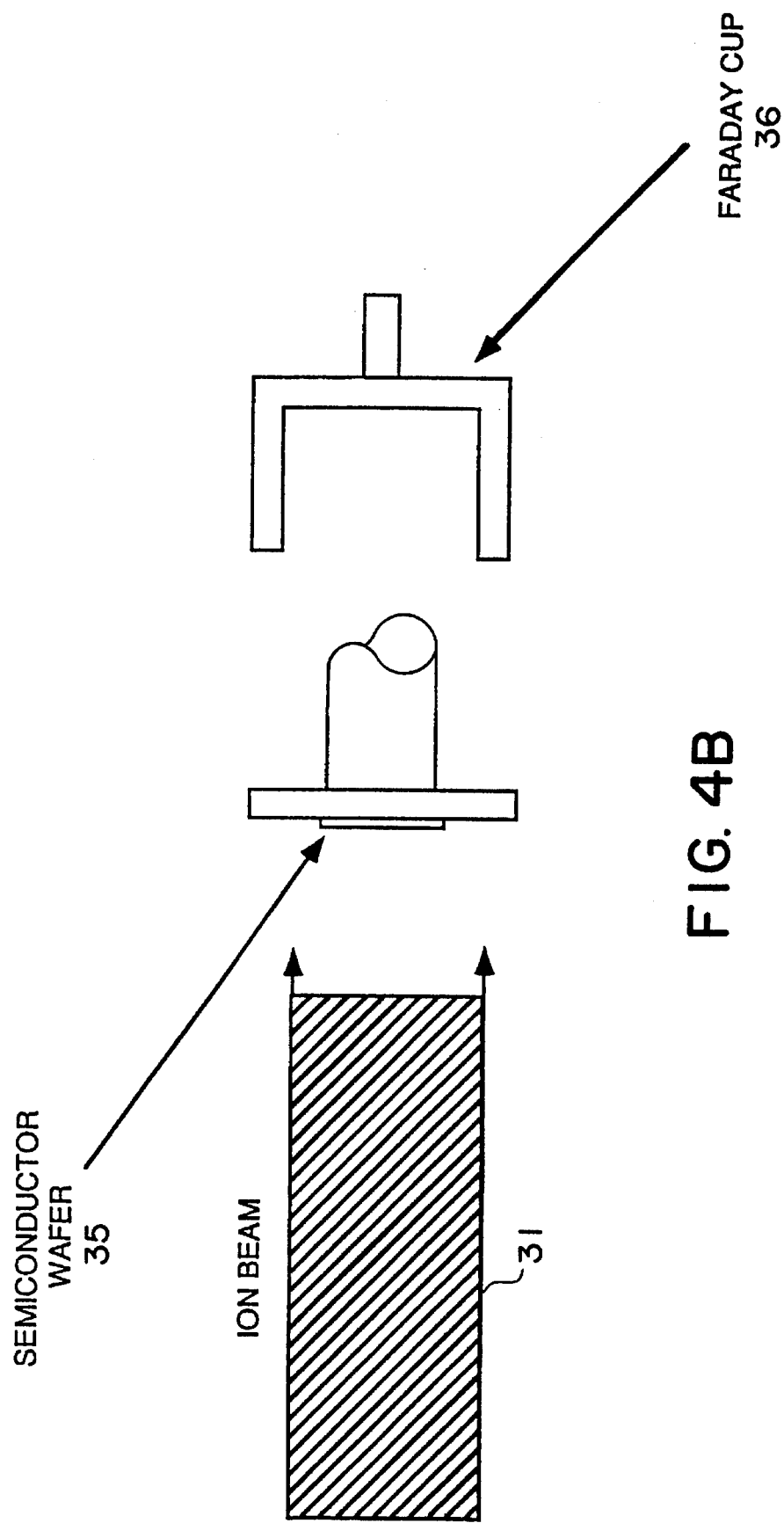
FIG. 4B is a somewhat diagrammatic side view of the apparatus of FIG. 4A.

In a third embodiment of the invention, a single semiconductor substrate 35 is mounted in an assembly 33 shown schematically in FIG. 4A and 4B. In this embodiment, the ion beam 31 is optimized in an insertable setup Faraday cup 32 situated upstream of the wafer mounting assembly 33. The beam at this point has an elongated ribbon shape (perpendicular to the plane of the drawing in FIG. 4A and parallel to the plane of the drawing in FIG. 4B) such that the length of the ribbon's cross-section is a minimum of two centimeters greater than the diameter of the semiconductor wafer 35. When the implant begins, the setup Faraday cup 32 is retracted and the ion beam impacts upon a Faraday cup 36 situated behind the wafer mounting assembly. At this point, none of the ions are impinging upon the semiconductor wafer. The beam current is integrated and used to drive a servomechanical system that imparts a motion (in the plane of the drawing in FIG. 4A and perpendicular to the plane of the drawing in FIG. 4B) to the wafer transverse to the elongated direction of the beam. By proper control of the servomechanical system, the wafer translates such that the ion beam translates from point A to point B such that a uniform distribution of ions are implanted into the wafer. At point B, the setup Faraday cup is re-inserted to intercept the ion beam. The wafer assembly is rapidly translated in the flyback mode from point B to point A. At this position, the setup Faraday cup is again retracted, and the cycle is repeated; that is to say, the current is integrated in the Faraday cup located behind the wafer mounting assembly and used to drive the servomechanical system from point A to point B.

This embodiment of the invention produces transient wafer temperatures that are reduced at all locations of the semiconductor wafer similar to those shown schematically in FIG. 2a.

Figure 5:
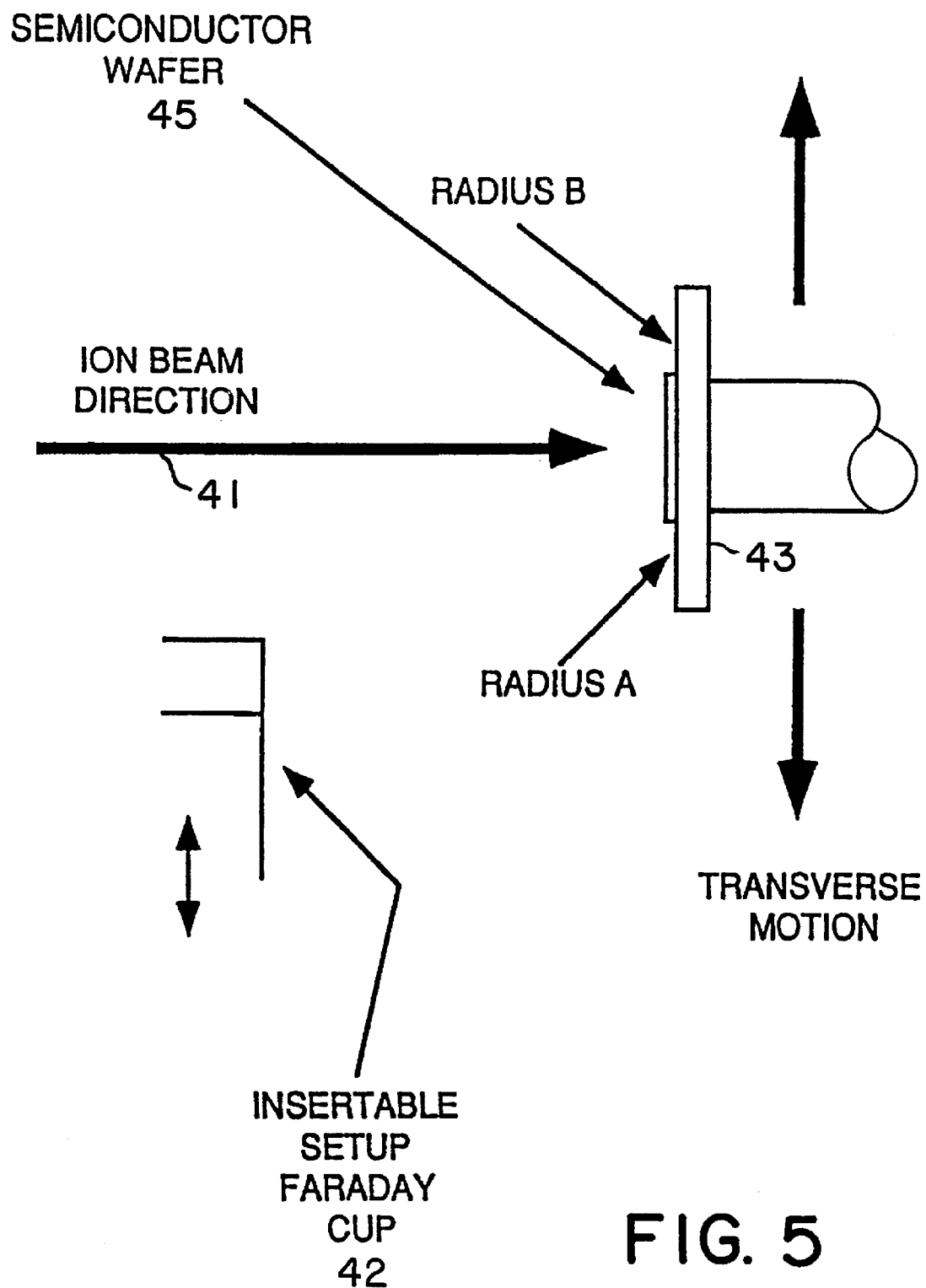
FIG. 5 is a diagrammatic sketch showing a second combination of a reciprocating target and an insertable setup Faraday cup in accordance with the invention.

In a fourth embodiment, a single semiconductor substrate 45 is mounted in an assembly 43 shown schematically in FIG. 5. In this embodiment, the ion beam 41 is optimized in a setup Faraday cup 42 situated upstream of the wafer mounting assembly 43. The beam at this point has an elongated ribbon shape (perpendicular to the plane of the drawing in FIG. 5) such that the length of the ribbon's cross-section is a minimum of two centimeters greater than the diameter of the semiconductor wafer 45. When the implant begins, the setup Faraday cup 42 is retracted and the ion beam impacts upon the wafer mounting assembly acting as a Faraday cup. At this point, none of the ions are impinging upon the semiconductor wafer. The beam current is integrated and used to drive a servomechanical system that imparts a motion (in the plane of the drawing in FIG. 5) to the wafer transverse to the elongated direction of the beam. By proper control of the servomechanical system, the wafer translates such that the ion beam translates from point A to point B such that a uniform distribution of ions are implanted into the wafer. At point B, the setup Faraday cup is re-inserted to intercept the ion beam. The wafer assembly is rapidly translated in the flyback mode from point B to point A. At this position, the setup Faraday cup is again retracted, and the cycle is repeated; that is to say, the current is integrated in the wafer mounting assembly Faraday cup and used to drive the servomechanical system from point A to point B.

This embodiment of the invention produces transient wafer temperatures that are reduced at all locations of the semiconductor wafer similar to those shown schematically in FIG. 2a.

Figure 6:
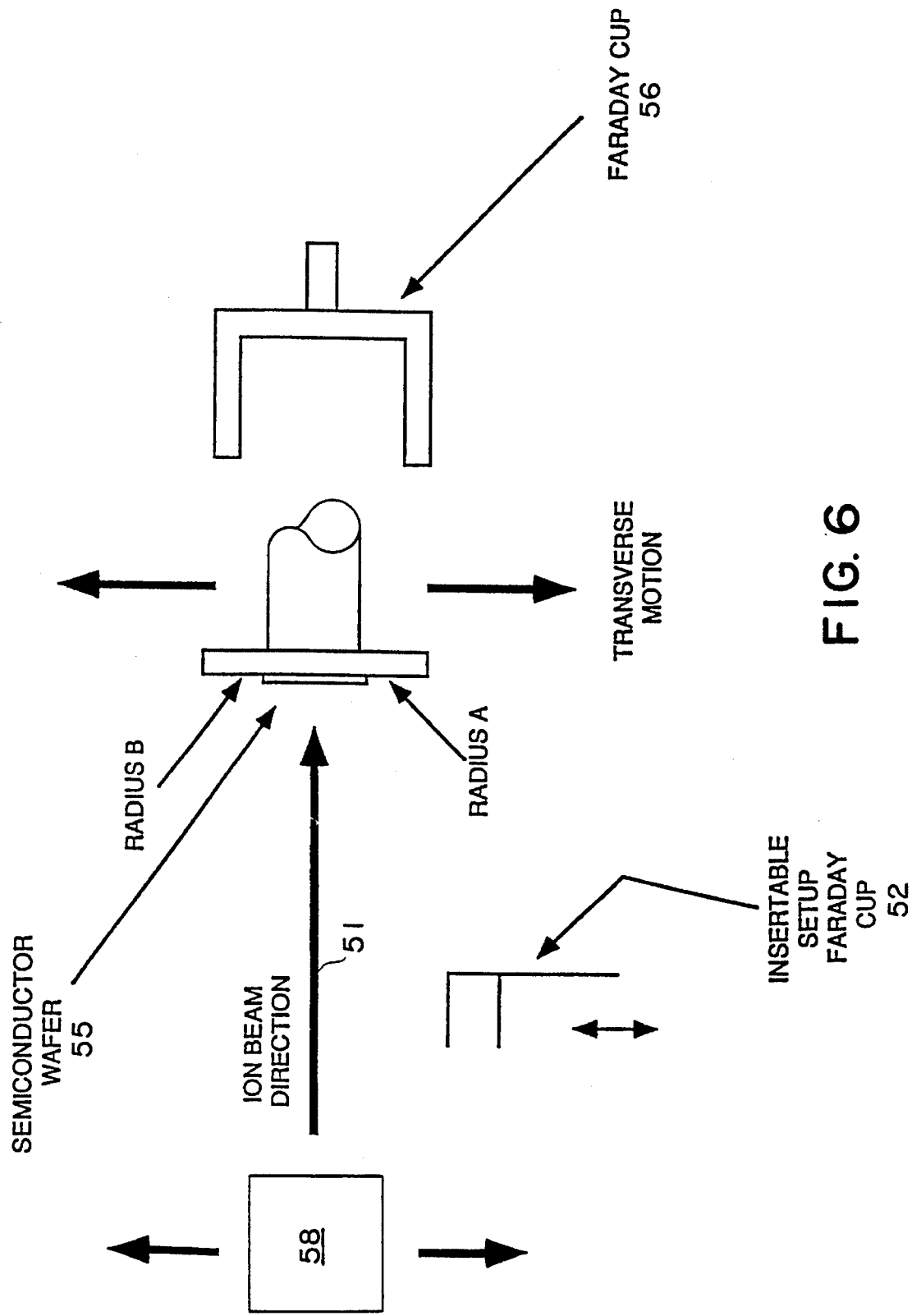
FIG. 6 is a diagrammatic sketch showing one combination of a reciprocating ion beam generation assembly, a target and an insertable setup Faraday cup in accordance with the invention.

In a fifth embodiment of the invention, a single semiconductor substrate 55 is mounted in an assembly 53 shown schematically in FIG. 6. In this embodiment, the ion beam 51 is optimized in a setup Faraday cup 52 situated upstream of the wafer mounting assembly 53. The beam at this point has an elongated ribbon shape (perpendicular to the plane of the drawing in FIG. 6) such that the length of the ribbon's cross-section is a minimum of two centimeters greater than the diameter of the semiconductor wafer 55. When the implant begins, the setup Faraday cup 52 is retracted and the ion beam impacts upon a Faraday cup 56 which is situated behind the wafer mounting assembly. At this point, none of the ions are impinging upon the semiconductor wafer. The beam current is integrated and used to drive a servomechanical system that imparts a motion (in the plane of the drawing in FIG. 6) to the ion beam generation assembly 58 transverse to the elongated direction of the beam. By proper control of the servomechanical system, the ion beam translates from point A to point B such that a uniform distribution of ions are implanted into the wafer. At point B, the setup Faraday cup is re-inserted to intercept the ion beam. The ion beam generation assembly is rapidly translated in the flyback mode from point B to point A. At this position, the setup Faraday cup is again retracted, and the cycle is repeated; that is to say, the current is integrated by the Faraday cup situated behind the wafer mounting assembly and used to drive the servomechanical system from point A to point B.

This embodiment of the invention produces transient wafer temperatures that are reduced at all locations of the semiconductor wafer similar to those shown schematically in FIG. 2a.

Figure 7:
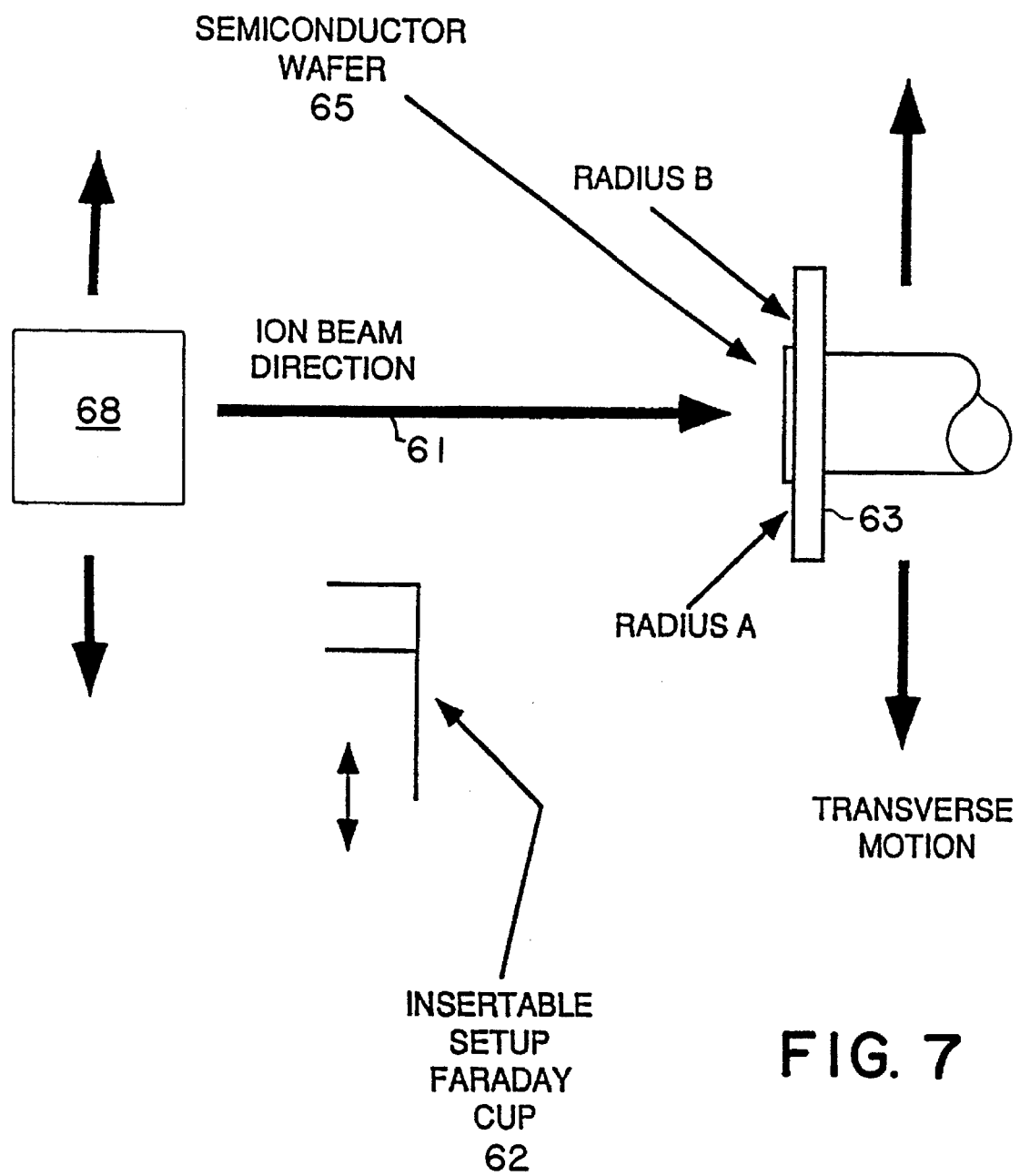
FIG. 7 is a diagrammatic sketch showing a second combination of a reciprocating ion beam generation assembly, a target and an insertable setup Faraday cup in accordance with the invention.

In a sixth embodiment, a single semiconductor substrate 65 is mounted in an assembly 63 shown schematically in FIG. 7. In this embodiment, the ion beam 61 is optimized in a setup Faraday cup 62 situated upstream of the wafer mounting assembly. The beam at this point has an elongated ribbon shape (perpendicular to the plane of the drawing in FIG. 7) such that the length of the ribbon's cross-section is a minimum of two centimeters greater than the diameter of the semiconductor wafer 65. When the implant begins, the setup Faraday cup 62 is retracted and the ion beam impacts upon the wafer mounting assembly which acts as a Faraday cup. At this point, none of the ions are impinging upon the semiconductor wafer. The beam current is integrated and used to drive a servomechanical system that imparts a motion (in the plane of the drawing in FIG. 7) to the ion beam generation assembly 68 transverse to the elongated direction of the beam. By proper control of the servomechanical system, the ion beam translates from point A to point B such that a uniform distribution of ions are implanted into the wafer. At point B, the setup Faraday cup is re-inserted to intercept the ion beam. The ion beam generation assembly is rapidly translated in the flyback mode from point B to point A. At this position, the setup Faraday cup is again retracted, and the cycle is repeated; that is to say, the current is integrated by the wafer mounting assembly acting as a Faraday cup and used to drive the servomechanical system from point A to point B.

This embodiment of the invention produces transient wafer temperatures that are reduced at all locations of the semiconductor wafer similar to those shown schematically in FIG. 2a.

Having thus described the principles of the invention, together with illustrative embodiments thereof, it is to be understood that although specific terms are employed, they are used in a generic and descriptive sense, and not for purposes of limitation, the scope of the invention being set forth in the following claims.

We claim:

1. Method of ion implantation comprising directing an ion beam at a target and mechanically imparting a scanning movement between said beam and said target, wherein slow active ion-implantation mechanical scans in one direction are alternated with rapid inactive ion-implantation mechanical scans in the reverse direction.

2. Method according to claim 1, wherein said inactive scans are rendered inactive by intercepting said ion beam prior to striking said target.

3. Method according to claim 1 including steps for reducing transient temperature effects while treating a workpiece with a radiation beam, the workpiece being mounted on the major surface of a target located in the path of the beam, which comprises the steps of:

rotating the target about an axis essentially parallel to the beam, repeatedly executing with the beam a traverse of the target along a path substantially perpendicular to the beam to trace a spiral path commencing on the target radially outside the workpiece and ending radially inside the workpiece, varying the traversing velocity as a function of the distance between said axis and the beam, gating off the ion beam after each such traverse and, prior to the next traverse, rapidly traversing the target along a path substantially perpendicular to the beam to trace a flyback spiral path commencing on the target radially inside the workpiece and ending radially outside the workpiece.

4. Method according to claim 1 including steps for reducing transient temperature effects while treating said target with said ion beam wherein said target comprises a substrate mounted on a wafer mounting assembly said steps comprising the following steps:

producing said ion beam in the form of an elongated ribbon shape, supporting a first Faraday cup in the path of said beam, mounting a single semiconductor substrate in an assembly, optimizing said ion beam in a setup Faraday cup situated upstream of the wafer mounting assembly so that the beam has an elongated ribbon shape such that the ribbon will have a length of at least two centimeters greater than the diameter of the substrate when it impinges on the substrate, retracting said setup Faraday cup so that said beam impinges on said first Faraday cup, integrating the beam current and using the integrated beam current to drive a servomechanical system that imparts motion to said assembly in a direction substantially perpendicular to said beam and transverse to its ribbon shape so that the ribbon of the beam sweeps over the assembly and the substrate mounted thereon from a start position at least some distance from one lateral side of said substrate to an end position at least some distance from the opposite lateral side of said substrate, controlling the servomechanical system so that a uniform distribution of ions are implanted into the substrate, re-inserting the setup Faraday cup to intercept the ion beam after it has reached its end position, and rapidly translating the assembly in a flyback mode.

5. Method according to claim 1 including steps for reducing transient temperature effects while treating said target with said ion beam wherein said target comprises a substrate mounted on a wafer mounting assembly said steps comprising the following steps:

producing said ion beam in the form of an elongated ribbon shape, mounting a single semiconductor substrate in an assembly adapted to act as a Faraday cup, optimizing said ion beam in a setup Faraday cup situated upstream of the wafer mounting assembly so that the beam has an elongated ribbon shape such that the ribbon will have a length of at least two centimeters greater than the diameter of the substrate when it impinges on the substrate, retracting said setup Faraday cup so that said beam impinges on said assembly acting as a Faraday cup, integrating the beam current and using the integrated beam current to drive a servomechanical system that imparts motion to said assembly in a direction substantially perpendicular to said beam and transverse to its ribbon shape so that the ribbon of the beam sweeps over the assembly and the substrate mounted thereon from a start position at least some distance from one lateral side of said substrate to an end position at least some distance from the opposite lateral side of said substrate, controlling the servomechanical system so that a uniform distribution of ions are implanted into the substrate, re-inserting the setup Faraday cup to intercept the ion beam after it has reached its end position, and rapidly translating the assembly in a flyback mode.

6. Method according to claim 1 including steps for reducing transient temperature effects while treating said target with said ion beam wherein said target comprises a substrate mounted on a wafer mounting assembly said steps comprising the following steps:

producing in an ion beam generation assembly said ion beam in the form of an elongated ribbon shape, supporting a first Faraday cup in the path of said beam, mounting a single semiconductor substrate in an assembly, optimizing said ion beam in a setup Faraday cup situated upstream of the wafer mounting assembly so that the beam has an elongated ribbon shape such that the ribbon will have a length of at least two centimeters greater than the diameter of the substrate when it impinges on the substrate, retracting said setup Faraday cup so that said beam impinges on said first Faraday cup, integrating the beam current and using the integrated beam current to drive a servomechanical system that imparts motion to said ion beam generation assembly in a direction substantially perpendicular to said beam and transverse to its ribbon shape so that the ribbon of the beam sweeps over the wafer mounting assembly and the substrate mounted thereon from a start position at least some distance from one lateral side of said substrate to an end position at least some distance from the opposite lateral side of said substrate, controlling the servomechanical system so that a uniform distribution of ions are implanted into the substrate, re-inserting the setup Faraday cup to intercept the ion beam after it has reached its end position, and rapidly translating the assembly in a flyback mode.

7. Method according to claim 1 including steps for reducing transient temperature effects while treating said target with said ion beam wherein said target comprises a substrate mounted on a wafer mounting assembly said steps comprising the following steps:

producing in an ion beam generation assembly said ion beam in the form of an elongated ribbon shape, mounting a single semiconductor substrate in an assembly adapted to act as a Faraday cup, optimizing said ion beam in a setup Faraday cup situated upstream of the wafer mounting assembly so that the beam has an elongated ribbon shape such that the ribbon will have a length of at least two centimeters greater than the diameter of the substrate when it impinges on the substrate, retracting said setup Faraday cup so that said beam impinges on said assembly acting as a Faraday cup, integrating the beam current and using the integrated beam current to drive a servomechanical system that imparts motion to said ion beam generation assembly in a direction substantially perpendicular to said beam and transverse to its ribbon shape so that the ribbon of the beam sweeps over the wafer mounting assembly and the substrate mounted thereon from a start position at least some distance from one lateral side of said substrate to an end position at least some distance from the opposite lateral side of said substrate, controlling the servomechanical system so that a uniform distribution of ions are implanted into the substrate, re-inserting the setup Faraday cup to intercept the ion beam after it has reached its end position, and rapidly translating the assembly in a flyback mode.

8. Apparatus for ion implantation comprising a target, means for directing an ion beam at said target, and means for mechanically imparting a scanning movement between said beam and said target, wherein slow active ion-implantation mechanical scans in one direction are alternated with rapid inactive ion-implantation mechanical scans in the reverse direction.

9. In apparatus according to claim 8, wherein said apparatus is of the type including (a) a moving support element for carrying a workpiece in a scanning direction, (b) means for providing relative translation between said support element and said beam in a control direction generally orthogonal to said scanning direction, (c) measuring means for measuring the intensity of said beam, and (d) control means for varying the speed of translation in said control direction, wherein said support element has a slot extending generally along said control direction, wherein said beam measuring means comprises means positioned behind said support element for measuring the intensity of said beam travelling through said slot, and wherein said control means comprises means for varying the speed of translation in said control direction in dependent response to said measured beam intensity travelling through said slot, the improvement comprising improved means for providing said relative translation wherein said translation is from a first terminal position which is outside said workpiece at one edge thereof to a second terminal position which is outside said workpiece at an edge thereof opposite said one edge, and improved control means wherein said control means includes means for rapid flyback translation from said second terminal position to said first terminal position, and wherein said apparatus includes means for intercepting said beam during said rapid flyback translation, thereby reducing transient temperature effects.

10. Apparatus according to claim 8 including components for reducing transient temperature effects while treating said target with said ion beam wherein said target comprises a substrate mounted on a wafer mounting assembly, said components comprising in combination:

means for producing said ion beam in the form of an elongated ribbon shape, a first Faraday cup supported in the path of said beam, a mounting assembly for mounting a single semiconductor substrate upon said mounting assembly, a setup Faraday cup situated upstream of the wafer mounting assembly, means to insert said setup Faraday cup so as to intercept said beam and optimize the beam so that it has an elongated ribbon shape such that the ribbon will have a length of at least two centimeters greater than the diameter of the substrate when it impinges on the substrate, means for retracting said setup Faraday cup so that said beam impinges on said first Faraday cup, a servomechanical system adapted to impart motion to said assembly in a direction substantially perpendicular to said beam and transverse to its ribbon shape so that the ribbon of the beam sweeps over the assembly and the substrate mounted thereon from a start position at least some distance from one lateral side of said substrate to an end position at least some distance from the opposite lateral side of said substrate, means for integrating the beam current collected by said first Faraday cup and using the integrated beam current to drive the servomechanical system and controlling it so that a uniform distribution of ions are implanted into the substrate, means for re-inserting the setup Faraday cup to intercept the ion beam after it has reached its end position, and means for rapidly translating the assembly in a flyback mode, so that said ion beam moves rapidly from said end position to said start position.

11. Apparatus according to claim 8 including components for reducing transient temperature effects while treating said target with said ion beam wherein said target comprises a substrate mounted on a wafer mounting assembly said components comprising in combination:

means for producing said ion beam in the form of an elongated ribbon shape, a mounting assembly for mounting a single semiconductor substrate thereupon, said mounting assembly being adapted to act as a Faraday cup, a setup Faraday cup situated upstream of the wafer mounting assembly, means to insert said setup Faraday cup so as to intercept said beam and optimize the beam so that it has an elongated ribbon shape such that the ribbon will have a length of at least two centimeters greater than the diameter of the substrate when it impinges on the substrate, means for retracting said setup Faraday cup so that said beam impinges on said assembly acting as Faraday cup, a servomechanical system adapted to impart motion to said assembly in a direction substantially perpendicular to said beam and transverse to its ribbon shape so that the ribbon of the beam sweeps over the assembly and the substrate mounted thereon from a start position at least some distance from one lateral side of said substrate to an end position at least some distance from the opposite lateral side of said substrate, means for integrating the beam current collected by said assembly acting as Faraday cup and using the integrated beam current to drive the servomechanical system and controlling it so that a uniform distribution of ions are implanted into the substrate, means for re-inserting the setup Faraday cup to intercept the ion beam after it has reached its said end position, and means for rapidly translating the assembly in a flyback mode, so that said ion beam moves rapidly from said end position to said start position.

12. Apparatus according to claim 8 including components for reducing transient temperature effects while treating said target with said ion beam wherein said target comprises a substrate mounted on a wafer mounting assembly said components comprising in combination:

an ion beam generation assembly for producing said ion beam in the form of an elongated ribbon shape, a first Faraday cup supported in the path of said beam, a mounting assembly for mounting a single semiconductor substrate thereupon, a setup Faraday cup situated upstream of the wafer mounting assembly, means to insert said setup Faraday cup so as to intercept said beam and optimize the beam so that it has an elongated ribbon shape such that the ribbon will have a length of at least two centimeters greater than the diameter of the substrate when it impinges on the substrate, means for retracting said setup Faraday cup so that said beam impinges on said first Faraday cup, a servomechanical system adapted to impart motion to said ion beam generation assembly in a direction substantially perpendicular to said beam and transverse to its ribbon shape so that the ribbon of the beam sweeps over the wafer mounting assembly and the substrate mounted thereon from a start position at least some distance from one lateral side of said substrate to an end position at least some distance from the opposite lateral side of said substrate, means for integrating the beam current collected by said first Faraday cup and using the integrated beam current to drive the servomechanical system and controlling it so that a uniform distribution of ions are implanted into the substrate, means for re-inserting the setup Faraday cup to intercept the ion beam after it has reached its end position, and means for rapidly translating the assembly in a flyback mode, so that said ion beam moves rapidly from said end position to said start position.

13. Apparatus according to claim 8 including components for reducing transient temperature effects while treating said target with said ion beam wherein said target comprises a substrate mounted on a wafer mounting assembly said components comprising in combination:

an ion beam generation assembly for producing said ion beam in the form of an elongated ribbon shape, a mounting assembly for mounting a single semiconductor substrate thereupon, said mounting assembly being adapted to act as a Faraday cup, a setup Faraday cup situated upstream of the wafer mounting assembly, means to insert said setup Faraday cup so as to intercept said beam and optimize the beam so that it has an elongated ribbon shape such that the ribbon will have a length of at least two centimeters greater than the diameter of the substrate when it impinges on the substrate, means for retracting said setup Faraday cup so that said beam impinges on said assembly acting as a Faraday cup, a servomechanical system adapted to impart motion to said ion beam generation assembly in a direction substantially perpendicular to said beam and transverse to its ribbon shape so that the ribbon of the beam sweeps over the wafer mounting assembly and the substrate mounted thereon from a start position at least some distance from one lateral side of said substrate to an end position at least some distance from the opposite lateral side of said substrate, means for integrating the beam current collected by said assembly acting as a Faraday cup and using the integrated beam current to drive the servomechanical system and controlling it so that a uniform distribution of ions are implanted into the substrate, means for re-inserting the setup Faraday cup to intercept the ion beam after it has reached its end position, and means for rapidly translating the assembly in a flyback mode, so that said ion beam moves rapidly from said end position to said start position.

* * * * *